(12) United States Patent
Sung (10) Patent No.: US 9,715,852 B2
(45) Date of Patent: Jul. 25, 2017

(54) ORGANIC LIGHT EMITTING DISPLAY DEVICE

(71) Applicant: LG DISPLAY CO., LTD., Seoul (KR)

(72) Inventor: Kiyoung Sung, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 60 days.

(21) Appl. No.: 14/939,163

(22) Filed: Nov. 12, 2015

(65) Prior Publication Data

US 2016/0141352 A1    May 19, 2016

(30) Foreign Application Priority Data

Nov. 13, 2014 (KR) .................. 10-2014-0158348

(51) Int. Cl.
| | |
|---|---|
| *H01L 27/12* | (2006.01) |
| *G09G 3/3266* | (2016.01) |
| *G11C 19/28* | (2006.01) |
| *G09G 3/3233* | (2016.01) |

(52) U.S. Cl.
CPC ......... *G09G 3/3266* (2013.01); *G09G 3/3233* (2013.01); *G11C 19/287* (2013.01); *G09G 2300/0814* (2013.01); *G09G 2300/0819* (2013.01); *G09G 2300/0842* (2013.01); *G09G 2300/0861* (2013.01); *G09G 2310/021* (2013.01); *G09G 2310/0205* (2013.01); *G09G 2310/0218* (2013.01); *G09G 2310/0286* (2013.01); *G09G 2310/08* (2013.01)

(58) Field of Classification Search
CPC . H01L 27/12; H01L 27/1222; H01L 27/3276; G09G 3/3266; G09G 230/0814; G09G 2310/0205; G11C 19/287
See application file for complete search history.

(56) References Cited

U.S. PATENT DOCUMENTS

| | | | |
|---|---|---|---|
| 2011/0102398 A1* | 5/2011 | Han | H03K 3/356139 345/209 |
| 2011/0102403 A1* | 5/2011 | Kim | G09G 3/3233 345/211 |
| 2015/0170568 A1* | 6/2015 | Lee | G11C 19/287 345/690 |

* cited by examiner

*Primary Examiner* — Phuc Dang
(74) *Attorney, Agent, or Firm* — Dentons US LLP

(57) ABSTRACT

An organic light emitting display device includes a display panel and a stage block. The display panel includes 4m (m is a natural number) number of horizontal lines in which organic light emitting diodes (OLEDs) are arranged. The stage block provides a scan signal and an emission control signal to each of the horizontal lines. An i (i is a natural number equal to or smaller than m) stage block includes a block signal generating unit, an emission control signal generating unit, and a plurality of scan signal generating units.

7 Claims, 8 Drawing Sheets

ORGANIC LIGHT EMITTING DISPLAY DEVICE

This application claims the benefit of Korea Patent Application No. 10-2014-0158348 filed on Nov. 13, 2014, the entire contents of which is incorporated herein by reference for all purposes as if fully set forth herein.

BACKGROUND OF THE INVENTION

Field of the Invention

The present disclosure relates to an organic light emitting display device.

Discussion of the Related Art

Due to advantages of compactness and light weight, flat panel displays (FPDs) have been widely used in portable computers or portable cellular terminals such as notebook computers, personal digital assistants (PDAs), as well as in monitors of desktop computers. FPDs include a liquid crystal display (LDD), a plasma display panel (PDP), a field emission display (FED), and an organic light emitting display device.

Among the FPDs, an organic light emitting display device has a fast response speed, expresses brightness with high luminous efficiency, and has a wide viewing angle. In general, in an organic light emitting display device, a data voltage is applied to a gate electrode of a driving transistor using a switching transistor turned on by a scan signal, and an organic light emitting diode (OLED) emits light using the data voltage supplied to the driving transistor. That is, a current supplied to the OLED is adjusted by the data voltage applied to the gate electrode of the driving transistor. Here, however, driving transistors respectively formed in pixels have threshold voltages Vth with variations. Due to the variations of threshold voltages of the driving transistors, a current value different from a designed value may be supplied to the OLED, and thus, brightness may be different from a desired value.

In order to compensate for a variation of a threshold voltage of a driving transistor, various methods have been proposed. One of the methods is compensating for a variation of a threshold voltage of a driving transistor using a sampling operation of saturating a gate-source potential of the driving transistor with a threshold voltage. As for the sampling operation, it is important to secure a sufficient time to saturate the gate-source potential of the driving transistor with the threshold voltage. However, since a horizontal period for scanning one horizontal line is shortened as resolution of a display panel is increased, it is not easy to secure a sampling period.

SUMMARY OF THE INVENTION

In an aspect of the present disclosure, an organic light emitting display device includes a display panel and a stage block. The display panel may include 4m (m is a natural number) number of horizontal lines in which organic light emitting diodes (OLED) are arranged. The stage block may provide a scan signal and an emission control signal to each of the horizontal lines. An ith (i is a natural number equal to or smaller than m) stage block may include a block signal generating unit, an emission control signal generating unit, and a plurality of scan signal generating units. An ith block signal generating unit may generate any one of first to fifth block signals using first to fifth gate clocks. An ith emission control signal generating unit may generate an ith emission control signal using first to fifth emission clocks. (4i−3)th to 4ith scan signal generating units may generate (4i−3)th to 4ith scan signals using ith to (i+3)th assist clocks, respectively.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
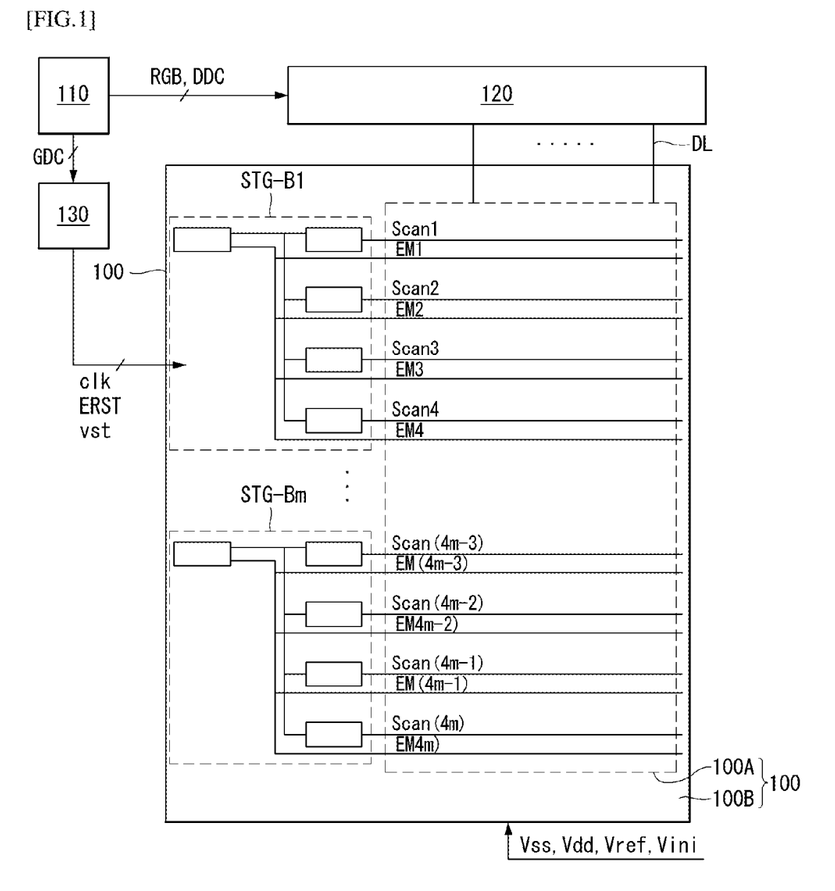
FIG. 1 is a view illustrating a configuration of an organic light emitting display device according to an embodiment of the present disclosure.
Figure 2:
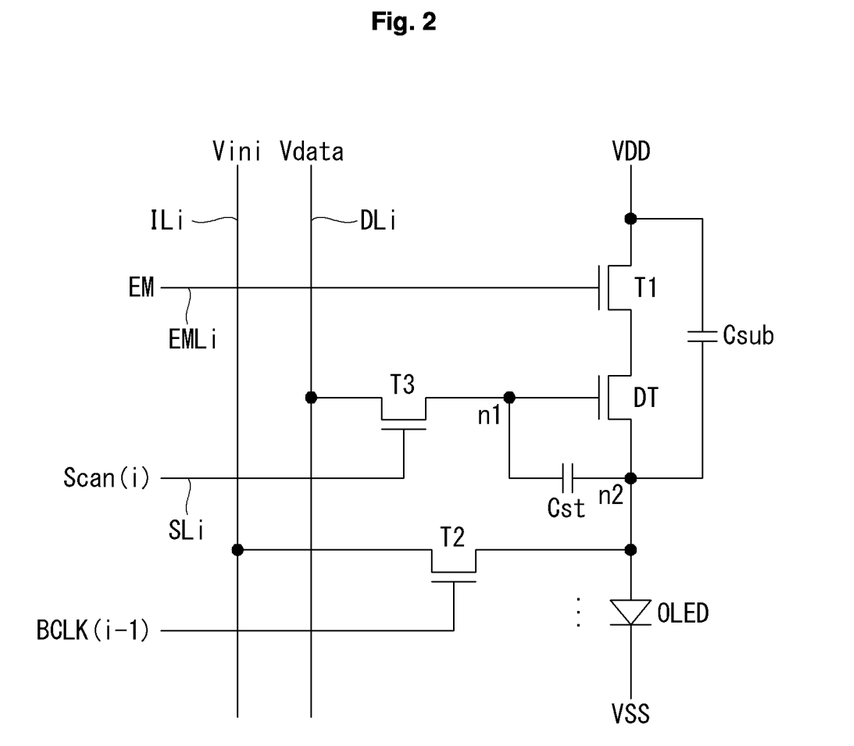
FIG. 2 is a view illustrating an example of a pixel structure illustrated in FIG. 1.

FIG. 1 is a view illustrating a configuration of an organic light emitting display device according to an embodiment of the present disclosure. FIG. 2 is a view illustrating an example of a pixel P arranged in an ith (I is a natural number equal to or smaller than 4m and m is a natural number) horizontal line HLi in FIG. 1.

Referring to FIGS. 1 and 2, a display device according to an embodiment of the present disclosure includes a display panel 100, a timing controller 110, a data driver 120, and scan drivers 130 and 140.

The display panel 100 includes a display area 100A in which subpixels are formed, and a non-display area 100B in which various signal lines or pads are formed, outside of the display area 100A. The display area 100A includes a plurality of pixels P, and displays an image on the basis of gray levels represented by pixels P. A plurality of pixels P are disposed along a horizontal line HL. The pixels P receives a scan signal SCAN and an emission control signal Em through the scan line SL and an emission line EML formed along the horizontal line HL. The pixels P receive a data voltage Vdata and an initialization voltage Vini through a data line DL and an initialization line IL connected to the data driver 120.

The timing controller 110 receives a vertical synchronization signal Vsync, a horizontal synchronization signal Hsync, a data enable signal DE, and a dot clock DCLK through an LVDS or TMDS interface reception circuit connected to an image board. The timing controller 110 generates a data control signal DDC for controlling an operation timing of the data driver 120 and a gate control signal GDC for controlling an operation timing of the scan drivers 130 and 140 with respect to an input timing signal.

The data driver 120 includes a plurality of source drive integrated circuits (ICs). The source drive ICs receives digital video data RGB and source timing control signal DDC from the timing controller 110. In response to the source timing control signal DDC, the source drive ICs convert digital video data RGB into a gamma voltage to generate a data voltage, and supplies the data voltage to data lines DL of the display panel 100.

The scan drivers 130 and 140 include a level shifter [add number] and a shift register [add number]. The shift register [add number] is formed in a gate-in-panel (GIP) type formed in a non-display area 100B of the display panel 100.

The level shifter [add number] is formed as an integrated circuit (IC) on a printed circuit board (PCB) (not shown) connected to the display panel 100. The level shifter [add number] level-shifts clock signals CLK and a start signal VST and supplies the level-shifted signals to the shift register [add number] under the control of the timing controller 11.

The shift register [add number] is formed as a combination of a plurality of TFTs in the non-display area 100B of the display panel 100 according to the GIP scheme. The shift register [add number] shifts and outputs a scan signal to correspond to the clock signals CLK and the start signal VST. In order to scan the first to mth horizontal lines HL1 to HLm, the shift register [add number] includes first to mth stage blocks STG_B1 to STG_Bm. Each of the stage blocks outputs a scan signal and an emission control signal provided to each of a plurality of horizontal lines HL.

In FIG. 2, each of the pixels P includes an OLED, a driving transistor DT, first to third transistors T1 to T3, a storage capacitor Cst, and a sub-capacitor Csub.

The OLED emits light by a driving current supplied from the driving transistor DT. A plurality of organic compound layers are formed between an anode electrode and a cathode electrode of the OLED. The organic compound layers include a hole injection layer (HIL), a hole transport layer (HTL), an emission layer (EML), an electron transport layer (ETL), and an electron injection layer (EIL). The anode electrode of the OLED is connected to a source electrode of the driving transistor DT, and a cathode electrode thereof is connected to a ground terminal VSS.

The driving transistor DT controls a driving current applied to the OLED by a voltage between a gate and a source thereof. To this end, the gate electrode of the driving transistor DT is connected to an input terminal of a data voltage Vdata, a drain electrode thereof is connected to an input terminal of a driving voltage VDD, and a source electrode thereof is connected to a low driving voltage VSS.

In response to the emission control signal EM, the first transistor T1 controls a current path between the driving voltage VDD input terminal and the driving transistor DT. To this end, a gate electrode of the first transistor T1 is connected to the emission line EML, a drain electrode thereof is connected to the driving voltage VDD input terminal, and a source electrode thereof is connected to the driving transistor DT.

In response to a scan signal SCAN(n−1) of a previous stage, the second transistor T2 provides an initialization voltage Vini provided from the initialization line IL to the second node n2. To this end, a gate electrode of the second transistor T2 is connected to a gate line 15a of a previous stage, a drain electrode thereof is connected to the initialization line IL, and a source electrode thereof is connected to the second node n2.

In response to a scan signal SCAN(n) of a current stage, the third transistor ST3 provides the reference voltage Vref or the data voltage Vdata provided from the data line 14b to the driving transistor DT. To this end, a gate electrode of the third transistor T3 is connected to a gate line GL of the current stage, a drain electrode thereof is connected to the data line 14b, and a source electrode thereof is connected to the driving transistor DT.

The storage capacitor Cst maintains the data voltage Vdata provided from the data line 14b during one frame to enable the driving transistor DT to maintain a constant voltage. To this end, the storage capacitor Cst is connected to the gate electrode and the source electrode of the driving transistor DT. The sub-capacitor Csub is connected to the storage capacitor Cst in series at the second node n2 to serve to increase efficiency of the driving voltage Vdata.

Figure 3:
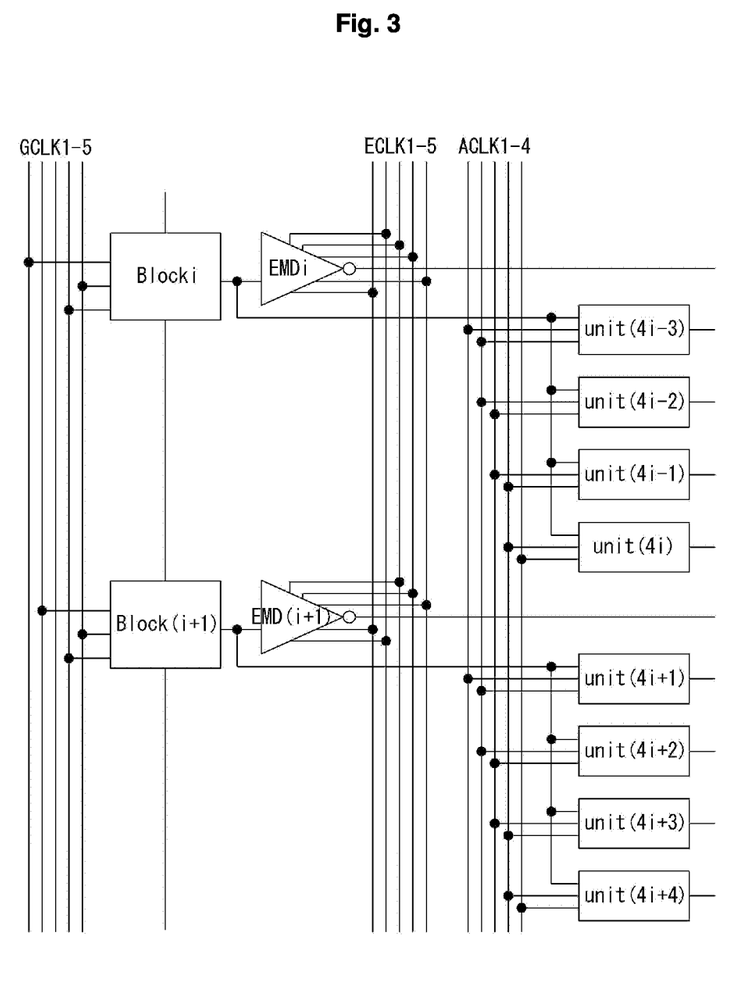
FIG. 3 is a view illustrating timing of a scan signal and an emission control signal for driving the pixel illustrated in FIG. 2.
Figure 4:
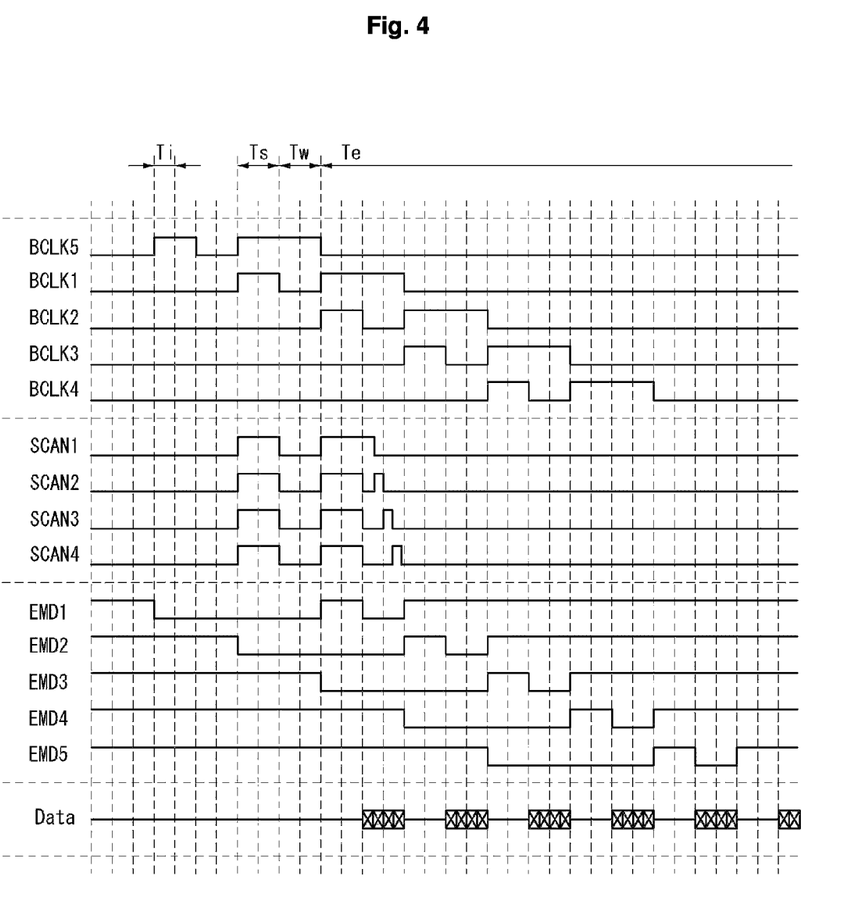
FIG. 4 is a view illustrating a configuration of a shift register according to an embodiment of the present disclosure.

FIG. 3 is a block diagram of a shift register according to an embodiment of the present disclosure. FIG. 4 is a waveform view illustrating signals output by a stage block illustrated in FIG. 3.

Referring to FIG. 3, the shift register [add number] according to a first embodiment includes first to mth stage blocks STG_B1 to STG_Bm. An ith (I is a natural number equal to smaller than m) stage block STG_Bi includes a block signal generating unit BLOCK, an emission control signal generating unit EMD, and a (4i−3)th to 4ith scan signal generating units UNIT (4i−3) to UNIT (4i).

The block signal generating unit BLOCK of the ith stage block STB_B(i) generates ith to (i+4)th block signals using a start signal VST or BCLK (i−1), an ith gate clock GCLKi, (i+2)th gate lock GCLK[i+2] and a (i+5)th gate clock GCLK[i+5], and outputs the generated block signals as output signals. The ith gate clock GCLKi input to the ith stage block STG_B(i) determines an output period of an output signal. The (i+2)th gate clock GCLK[i+2] determines an end time of an output signal and the (i+4)th gate clock s, GCLK[i+4] sets a potential of a node.

Any one of first to fifth block signals output by the ith block signal generating unit BLOCKi is used as a clock of the ith emission control signal generating unit EMDi. The ith block signal BCLKi output by the ith block signal generating unit BLOCKi controls the second transistor T2 arranged in the horizontal lines HL corresponding to the (i+1)th stage block STG_B(i−1).

The emission control signal generating unit EMD of the ith stage block STG_B(i) generates an ith emission control signal Emi by using the ith block signal BCLKi, the ith emission clock ECLKi, the (i+2)th emission clock ECLK(i+2), the (i+1)th emission clock ECLK(i+1), and the (i+4)th emission clock ECLK(i+4). The ith emission control signal Emi controls the first transistor T1 arrange at the horizontal lines HL(4i−3) to HL4i corresponding to the ith stage block STG_Bi.

The ith stage block STG_B(i) includes (4i−3)th scan signal generating unit UNIT(4i−3) to 4ith scan signal generating unit UNIT(4i). Each of the scan signal generating units UNIT generates a scan signal SCN by using a start signal VST or BCLK(i−1), the ith block signal GCLKi, the (i_2)th block signal BCLK(i+2), and the (i+3)th block signal BCLK(i+3). Each scan signal controls the third transistor T3 of the pixels P.

An operation of the pixel P according to an embediment of the present invention will be described with reference to FIG. 4. In the following description, one horizontal period 1H refers to a scan period required for scanning one horizontal line HL when a horizontal line HL is scanned according to a sequential method. The scan period includes a sampling period and a data write period. In the method for driving an organic light emitting display device according to an embodiment of the present invention, a predetermined period of the scan period of a plurality of horizontal lines overlaps. For example, four horizontal lines are set to one block, and sampling periods of a scan period of each block overlap. Thus, in the related art, since four horizontal lines are sequentially scanned during four horizontal period H, a sampling stage and a data write stage are performed during 1 horizontal period H. In contrast, in the present invention, since the sampling period with respect to four horizontal lines overlaps, the sampling period may be further secured.

Hereinafter, driving of the present invention based on the first stage block STG_B will be described.

Referring to FIG. 4, an operation of the pixel P according to the present invention includes an initialization period Ti for initializing a gate-source potential of the driving transistor DT by a specific voltage, a sampling period Ts for detecting a threshold voltage of the driving transistor DT, a data write period of applying a data voltage Vdata, and an emission period Te for emitting light by compensating a driving current applied to the OLED using a threshold voltage and a data voltage Vdata, irrespective of the threshold voltage.

During the initialization period Ti, the second transistor T2 arranged in the first to fourth horizontal lines HL1 to HL4 supplies an initialization voltage Vini provided from the initialization line IL to the second node n2 in response to a fifth block signal BCLK5. Thus, a source voltage Vs of the driving transistor DT as a voltage of the node n2 has a potential of the initialization voltage Vini.

The third transistor T3 arranged in the first horizontal line HL supplies a reference voltage Vref provided from the data line DL to the first node n1 in response to the first scan signal SCAN1. Similarly, the third transistors T3 arranged in the second horizontal line H2 to the fourth horizontal line H4 provide the reference voltage Vref to the first node n1 in response to second to fourth scan signals SCAN2 to SCAN4. A gate voltage Vg of the driving transistor DT disposed in the first to fourth horizontal lines HL which have received the reference voltage Vref has a potential of the reference voltage Vref. The initialization voltage Vini supplied to the second node n2 during the initialization period T is to initialize the pixel P to a predetermined level, and here, a magnitude of the initialization voltage Vini is set to a value smaller than that of an operation voltage of the OLED such that the OLED may not emit light. For example, the initialization voltage Vini may be set to have a voltage having a magnitude ranging from −1 to +1 (V).

During the sampling period Ts, the third transistor T3 arranged in the first horizontal line HL supplies the reference voltage Vref provided from the data line DL to the first node n1 in response to the first scan signal SCAN1. Similarly, the third transistors T3 arranged in the second horizontal line HL to the fourth horizontal line HL supply the reference voltage to the first node n1 in response to the second to fourth scan signals SCAN2 to SCAN4. The first transistors T1 arranged in the first to fourth horizontal lines HL1 to HL4 supply the driving voltage VDD to the driving transistor DT in response to the first emission control signal EM1. Here, a gate electrode voltage Vg of the driving transistor maintains the reference voltage Vref. As the second node n2 is in a floating state, current flowing through the first transistor T1 and the driving transistor DT when the voltage of the second node n2 is at the voltage of the second node n2 is accumulated. The voltage increased through the sampling period Ts is saturated as a voltage having a magnitude corresponding to a difference between the reference voltage Vref and the threshold voltage Vth of the driving transistor DT. That is, through the operation of the sampling period Ts, a potential difference between the gate and source of the driving transistor DT arranged in the first to fourth horizontal line HL is equal to a magnitude of the threshold voltage Vth.

During the data write period Tw, the pixels P arranged in the first to fourth horizontal lines HL sequentially write data.

First, the first and second transistors T! and T2 arranged in the first horizontal line HL are turned off. The third transistor T3 arranged in the first horizontal line HL supplies the data voltage Vdata provided from the data line 14b in response to the first scan signal SCAN 1. Here, the voltage of the second node n2 in a floated state is coupled according to a ratio of the storage capacitor Cs and the sub-capacitor C1 so as to be increased or decreased.

After data writing of the pixels P arranged in the first horizontal line HL is terminated, data writing of the pixels P arranged in the second to third horizontal lines HL is performed.

During the emission period Te, the second transistor T2 of the pixels P arranged in the first to fourth horizontal lines HL is maintained in the turned-off state, the third transistor T3 is turned off, and the first transistor T2 is turned on. During the emission period, the data voltage Vdata stored in the storage capacitor Cs is supplied to the OLED, and thus, the OLED emits light with brightness in proportion to the data voltage Vdata. Here, as current flows in the driving transistor by the voltage of the first node n1 and the second node n2 determined during the data write period Tw, a desired current is supplied to the OLED, and accordingly, the OLED may adjust brightness by the data voltage Vdata.

Figure 5:
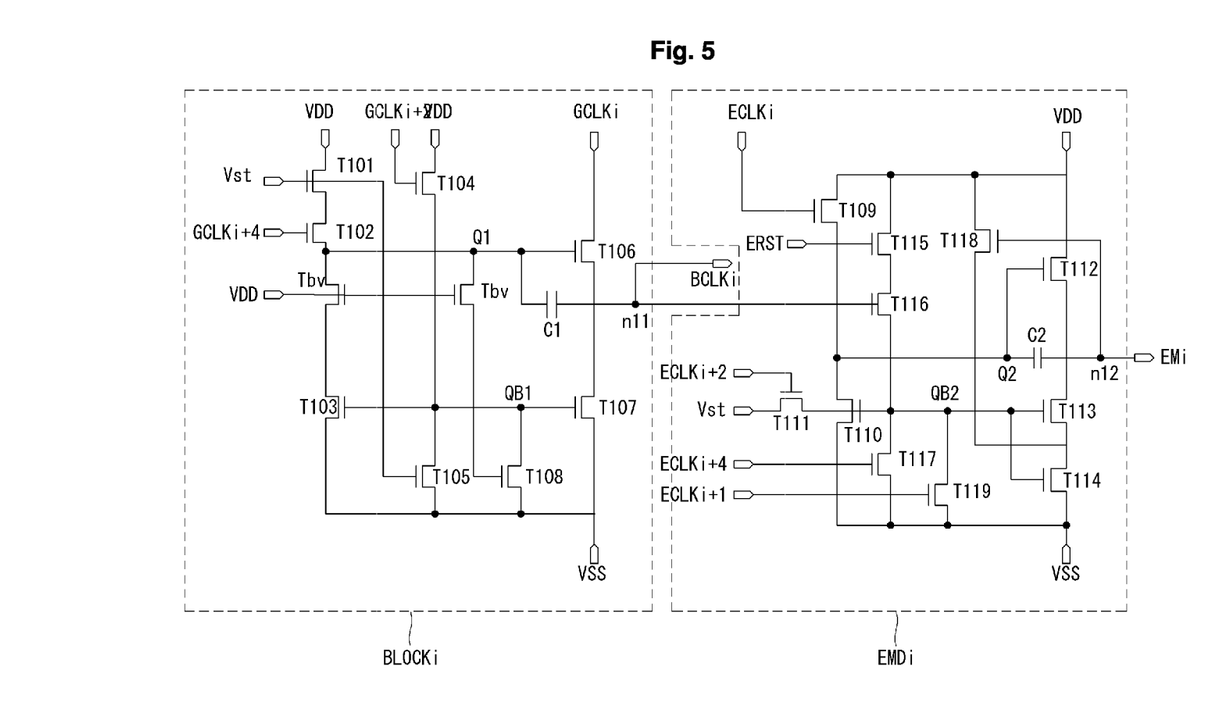
FIG. 5 is a circuit diagram of an ith stage according to a first embodiment of the present disclosure.
Figure 6:
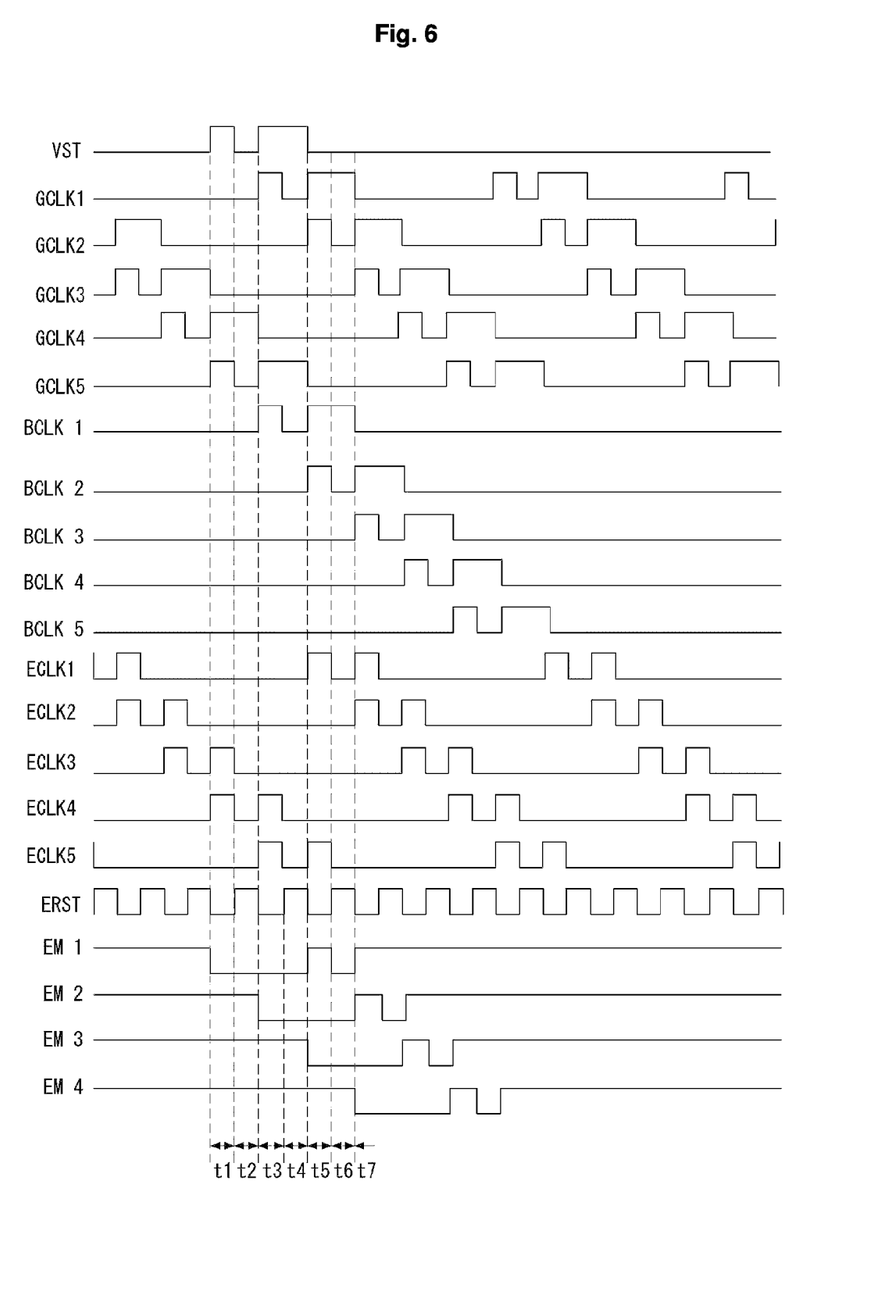
FIG. 6 is a timing diagram of an operation of an ith stage illustrated in FIG. 5.

FIG. 5 is a circuit diagram of the block signal generating unit BLOCK and the emission control signal generating unit EMD of the ith stage block (STG_B), and FIG. 6 is a waveform view illustrating input signals and output signals of the circuit diagram illustrated in FIG. 5. Hereinafter, operations of the block signal generating unit BLOCK and the emission control signal generating unit EMD of the ith stage block STG_Bi will be described. In the following description, an example in which the ith block signal generating unit BLOCKi and the ith emission control signal generating unit EMDi generate the ith block signal BCLKi and the ith emission control signal Emi, respectively, will be described.

The gate clock GCLK and the emission clock ECLK are implemented to have five phases, and each clock signal is continuous. Thus, as a clock signal in which (i+k) (k is a natural number and 1<k<5) is greater than 5, a clock signal of a 5 subtracted ordinary is used. For example, the (i+4)th gate clock GCLK(i+4) corresponds to the second gate clock GCLK2 in the third stage STG3.

According to the regularity, the ith block signal generating unit BLOCKi outputs a first block signal BCLK1 by using the start signal VST, the first gate clock GCLK, the third gate clock GCLK3, and the fifth gate clock GCLK5. The ith gate clock GCLKi input to the ith block signal generating unit BLOCK determines an output period of the ith block signal BCLKi. The (i+2)th gate clock GCLK(i+2) determines an end time point of the ith block signal BCLKi, and (i+4)th gate clock GCLK(i+4) performs an operation of charging first Q node (Q) before outputting the ith block signal BCLKi.

The ith emission control signal generating unit EMD outputs a first emission control signal EM1 using the first scan signal SCAN1, the first emission clock ECLK1, the second emission clock ECLK2, the third emission clock ECLK3, and the fifth emission clock ECLK5. Also, the emission control signal generating unit 140b of the first stage STG1 initializes the first emission control signal EM1 by using an emission reset ERST. An ith emission clock ECLKi input to the ith emission control signal generating unit EMD determines an output timing of the ith emission control signal Emi. An (i+2)th emission clock ECLK(i+2) determines an end time point of the emission control signal EM(i−1) which was output to a previous frame. (i+1)th emission clock ECLK(i+1) and an (i+4)th emission clock ECLK(i+4) controls the ith emission control signal EMi to maintain a high level.

Circuit configurations of the ith block signal generating unit BLOCKi and the ith emission control signal generating unit will be described. In FIG. 5, auxiliary transistors Tbv maintained at the turned-on state all the time by a high potential voltage VDD serve to stabilize the circuit, and since the auxiliary transistors Tbv maintain the turned-on stage all the time, it will be regarded that the auxiliary transistors Tbv are in a short state by equivalent circuit.

The ith block signal generating unit BLOCKi includes first to eighth transistors T101 to T108.

The first electrode of the first transistor T101 is connected to the high potential voltage source VDD, a second electrode thereof is connected to a first electrode, and a gate electrode thereof is connected to an input terminal of a start signal VST. A second electrode of the second transistor T102 is connected to a first Q node Q1, and a gate electrode thereof is connected to an input terminal of the (i+4)th gate clock GCLK(i+4). Since the first and second transistors T101 and T102 are connected in series, when the first and second transistors T1 and T2 are simultaneously turned on, they charges the high potential voltage VDD in the first Q node Q1. That is, the first and second transistors T101 and T102 charge the first Q node Q1 when the start signal VST (or (i−1)th scan signal (SCAN(i−1)) and the (i+4)th gate clock GCLK (i+4) are synchronized.

A first electrode of the third transistor T103 is connected to the first Q node Q1, and a second electrode thereof is connected to the low potential voltage VSS, and a gate electrode thereof is connected to a first QB node QB1. Thus, the third transistor T103 discharges a potential of the Q node to a low potential voltage VSS to correspond to a potential of the first QB node QB1.

The fourth transistor T104 receives the high potential voltage VDD through a first electrode, a second electrode thereof is connected to the first QB node QB1, and a gate electrode thereof is connected to the (i+2)th gate clock GCLK(i+2). Thus, the fourth transistor T104 charges the first QB node QB1 in response to the (i+2)th gate clock GCLK(i+2). That is, the fourth transistor 104 discharges a first output terminal n11 to output an ith block signal BCLKi having a low potential level in response to the (i+2)th gate clock GCLK(i+2).

A fifth electrode of the fifth transistor T105 is connected to the first QB node QB1, a second electrode is connected to the low potential voltage VSS, and a gate electrode thereof receives a start signal through a start signal input terminal. The fifth transistor T105 charges the first QB node QB1 with the low potential voltage in response to the start signal VST or the (i−1)th scan signal SCAN(i+1).

A gate electrode of the sixth transistor T106 is connected to the first Q node Q, a first electrode thereof is connected to an input terminal of the ith gate clock GCLKi, and a second electrode thereof is connected to the first output terminal n11. Thus, the sixth transistor T106 outputs an ith gate clock GCLKi to correspond to the potential of the first Q node Q1.

A gate electrode of the seventh transistor T107 is connected to the first QB node QB, the low potential voltage VSS is received through a first electrode thereof, and a second electrode thereof is connected to the first output terminal n11. Thus, the seventh transistor T107 discharges a potential of the first output terminal n11 to the low potential voltage VSS to correspond to the potential of the first QB node QB1.

A first electrode of the eighth transistor T108 is connected to the first QB node QB1, a second electrode thereof is connected to the low potential voltage VSS, and a gate electrode is connected to the first Q node Q1. Thus, the eighth transistor T108 discharges a potential of the first Q node Q1 to a low potential voltage to correspond to the potential of the first Q node Q1.

The ith emission control signal generating unit EMD includes ninth to 19th transistor T119.

A first electrode of the ninth transistor T109 is connected to the high potential voltage VDD, a second electrode thereof is connected to the second Q node Q2, a gate electrode thereof is connected to an input termination of an emission clock ECLKi. Thus, the ninth transistor T109 charges the second Q node Q2 in response to the ith emission clock ECLKi.

A first electrode of the tenth transistor T110 is connected to the second Q node Q2, a second electrode thereof is connected to a low potential voltage VSS, and a gate electrode is connected to the second QB node QB2. Thus, the tenth transistor T110 discharges a potential of the second Q node Q2 to a low potential voltage to correspond to the potential of the second QB node QB2.

A first electrode of the eleventh transistor T111 is connected to the second QB node QB2, a second electrode thereof is connected to an input terminal of the start signal VST, and a gate electrode thereof is connected to an (i+2)th emission clock ECLK(i+2). Thus, the eleventh transistor T111 provides a potential of the start signal VST to the second QB node QB2 in response to the (I+2)th emission clock ECLK(i+2).

A first electrode of the 12th transistor T112 is connected to the high potential voltage VDD, a second electrode thereof is connected to the second output terminal n12, and a gate electrode thereof is connected to the second Q node Q2. Thus, the 12th transistor T112 outputs an ith emission control signal Emi corresponding to the high potential voltage VDD to the second output terminal n12 to correspond to the potential of the second Q node Q2.

The 13th and 14th transistors T113 and T114 are connected in series, and gate electrodes of the 13th and 14th transistors T114 are connected to the second QB node QB2, a first electrode of the 13th transistor T113 is connected to the second output terminal n12, and a second electrode of the 14th transistor T114 is connected to the low potential voltage VSS of the 14th transistor T114. Thus, the 13th and 14th transistors T114 discharges a potential of the second output terminal n12 to a low potential voltage VSS to correspond to the potential of the second QB node QB2.

A first electrode of the reset switching transistor T115 is connected to the high potential voltage VDD, a second electrode is connected to the second QB node QB2, and a gate electrode thereof is connected to a ninth terminal 9 for receiving an emission reset ERST. Thus, the reset switching transistor T115 charges the second QB node QB2 to the high potential voltage VDD in response to the emission reset ERST.

A scan synchronization transistor T116 is formed between the reset switching transistor T115 and the second QB node QB2, and a gate electrode thereof is connected to the first output terminal n11. Thus, when an ith scan signal SCANi is provided through the first output terminal n11, the scan synchronization transistor T115 charges the high potential voltage VDD to the second QB node QB2.

A first electrode of the 17th transistor T117 is connected to the second QB node QB, a second electrode is connected to the low potential voltage VSS, and a gate electrode thereof is connected to an input terminal of the emission clock ECLK(i+4). A first electrode of the 19th transistor T119 is connected to the second QB node QB2, a second electrode thereof is connected to the low potential voltage VSS, and a gate electrode thereof is connected to the input terminal of the (i+1)th emission clock ECLK(i+1). Thus, the 17th and 19th transistors T117 and T119 turn off the 13th transistor T113 and the 14th transistor T114 in response to the (i+4)th emission clock and the (i+1)th emission clock ECLK(i+1).

A first electrode of the 18th transistor T118 is connected to the low potential voltage VDD, a second electrode thereof is connected to a second electrode of the 13th transistor T113, and a gate electrode thereof is connected to a second output terminal n12.

Operation processes of the ith block signal generating unit BLOCK and the ith emission control signal generating unit will be described with reference to FIG. 6.

First, a process in which the ith block signal generating unit BLOCK outputs a first block signal BCLK1 will be described.

During a first period t1 at which a current frame starts, the first and second transistors T102 are turned to charge the first Q node Q1 in response to a start signal VST having a high level and a fifth gate clock GCLK5, respectively. That is, the first Q node Q1 is precharged while the start signal VSS and the fifth gate clock GCLK5 are synchronized.

In a state in which the first Q node Q1 is precharged, a potential of a first electrode of a pull-up transistor T106 is increased when the first gate clock GCLK1 is provided through the input terminal of the first gate clock GCLK1. When the potential of the first electrode of the first pull-up transistor T106 is increased, a potential of a gate electrode thereof is bootstrapped and increased to maintain the potential of the first boosting capacitor C1. That is, a gate-source potential of the first pull-up transistor T106 is further increased by the potential provided to the first electrode in a state in which the gate electrode is precharged, so as to be turned on. The first pull-up transistor T106 outputs the first gate clock GCLK1 input through the first electrode to the block signal output voltage n11.

When the first Q node A1 is charged, the eighth transistor T8 maintains the gate voltage of the first pull-down transistor T7 at a low potential voltage VSS. That is, the eighth transistor T8 prevents the scan signal output terminal n11 from being discharged while the first pull-up transistor T6 outputs a first block signal BCLK1.

A process in which the emission control signal generating unit EMD outputs a first emission control signal (EM1) will be described.

During the first period t1, the start signal VST and the third emission clock ECLI3 are synchronized, and thus, the 11th transistor T111 charges the second QB node QB2. As the QB node QB2 is charged, the 13th and 14th transistors T113 and T114 are turned on. That is, a potential of the second output terminal n12 maintained at a high level during the emission period Te of a previous frame period is discharged to the low potential voltage VSS.

During a third period t3 after the first transition period t2, the 17th transistor T117 is turned in response to the fifth emission clock ECLK5, and as the 17th transistor T117 is turned on, the second QB node QB2 is maintained at the low potential voltage VSS.

During the fifth period t5, the ninth transistor T109 is turned by the emission clock ECLK1. That is, the ninth transistor T109 receives the high potential voltage VDD in response to the first emission clock ECLK1 having a high level to charge the second Q node Q2. As the second Q node Q2 is charged, the 12th transistor T112 is turned on and the high potential voltage VDD is output to the second output terminal n12 by way of the 12th transistor T112. That is, during the fifth period t5, the second output terminal n12 outputs a first emission control signal EM1 having a voltage level of the high potential voltage VDD.

During a sixth period t6, each of the 15th and scan synchronization transistors T115 and T115 are turned on in response to the emission reset ERST and the first scan signal SCAN1 of the high potential. Thus, the second QB node QB2 is charged, and accordingly, the 13th and 14th transistors T113 and T114 are turned on. As the 13th and 14th transistors T113 and T114 are turned on, the second output terminal n12 which has output the voltage level having the high potential voltage VDD during the fifth period t5 is discharged to the low potential voltage VSS. That is, during the sixth period t6, the emission reset ERST having the high potential and the first scan signal SCAN1 having the high potential discharge the first emission control signal EM1 at a low potential to initialize the second output terminal n12.

During the seventh period t7, the ninth transistor T109 outputs a high potential voltage VDD to the second output terminal n12 in response to the first emission clock ECLK1 having a high potential voltage level.

Also, during the seventh period t7, the 19th transistor T119 is turned on in response to the second emission clock ECLK2 having a high potential voltage level and maintains the second QB node QB2 at the low potential. That is, during the seventh period T7, the 19th transistor T119 maintains the 13th and 14th transistors T113 and T114 in the turned-off state.

During the emission period Te, a sixth terminal 6 and an eighth terminal 8 receive the second emission clock ECLK2 and the fifth emission clock ECLK5 at a predetermined interval. That is, during the emission period Te, the 17th transistor S117 and the 19th transistor T119 are alternately turned on to maintain the second QB node QB2 at a low potential voltage, and accordingly, the 13th and 14th transistors 113 and 114 are restrained from being turned on. That is, the second and fifth emission clocks ECLK2 and ECLK5 stably output the first emission control signal EM1 having a high potential through the second output terminal h12 during the emission period Te.

Since the first scan signal SCAN1 maintains the low potential during the emission period Te the second QB node floats. Thus, the potential of the second QB node QB2 may be unstable during the emission period Te, and here, the shift register [add number] of the first embodiment stabilizes the potential of the second QB node QB2 during the emission period Te by using the second and fifth emission clocks ECLK2 to ECLK5. Thus, the shift register [add number] of the first embodiment stably outputs the first emission control signal EM1 through the second output terminal n12 during the emission period Te.

Figure 7:
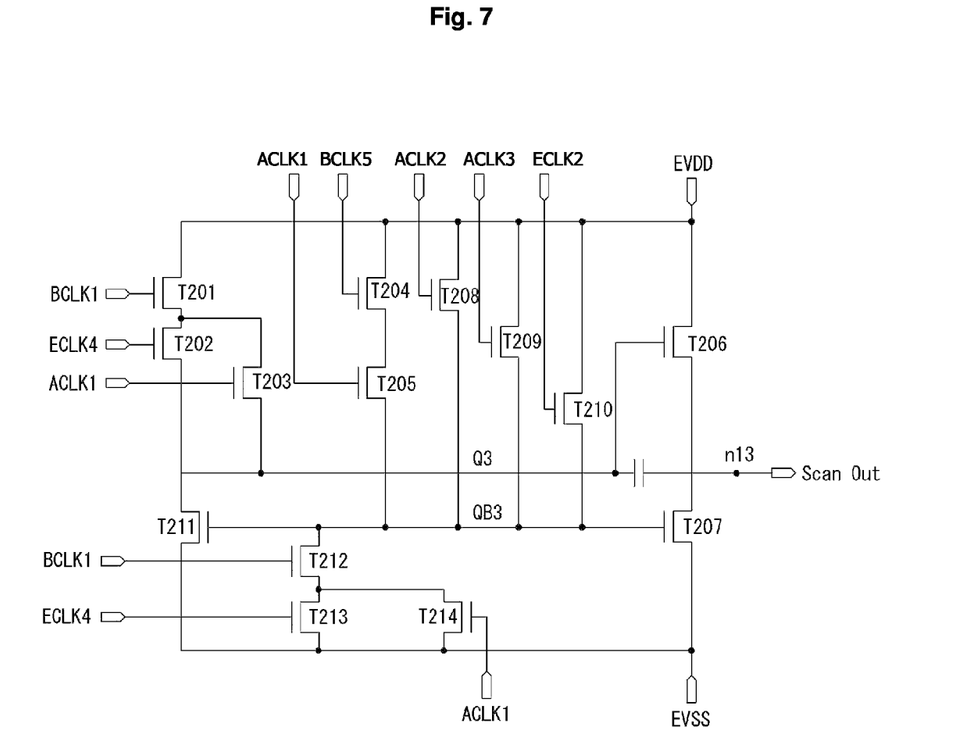
FIG. 7 is a circuit diagram of an ith stage according to a second embodiment of the present disclosure.
Figure 8:
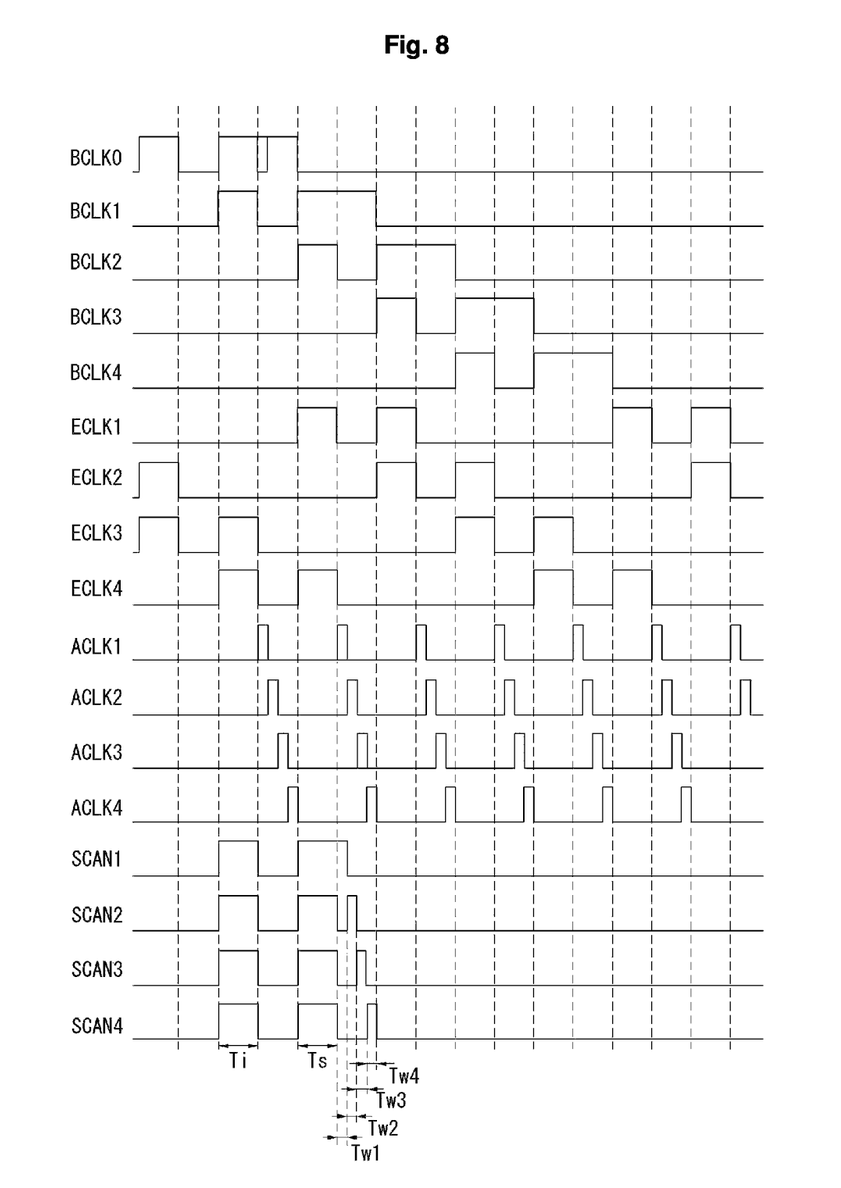
FIG. 8 is an equivalent circuit diagram based on connection relations of reset switching transistors in stages according to the first embodiment of the present disclosure.

FIG. 7 is a circuit diagram of an ith scan signal generating unit UNIT and FIG. 8 is a waveform view of input signals and output signals of the circuit diagram illustrated in FIG. 7. Hereinafter, operations of the block signal generating unit and the emission control signal generating unit EMD of the stage block STG_B will be described.

The ith scan signal generating unit UNIT outputs a first scan signal SCAN1 by using ith and (i+4)th block signals BCLKI and BCLK(i+4), ith to (i+2)th assist clocks ACLK(i) and ACLK(+2), and (i+1)th and (i+3)th emission clocks ECLK(I+1) ECLK (i+3).

The ith scan signal generating unit UNIT1 includes first to 14th transistors T201 to T214.

A first electrode of the first transistor T201 is connected to the high potential voltage source VDD, a second electrode is connected to the first electrode of the second transistor T202, and a gate electrode thereof is connected to an ith block signal BCLKi input terminal. A second electrode of the second transistor T202 is connected to the ith block signal BCLKi input terminal. A second electrode of the second transistor T202 is connected to the Q node Q3, and a gate electrode thereof is connected to an input terminal of the (1+4)th emission clock ECLK(I+4). The first and second transistors T201 and T202 are connected in series, and when the first and second transistors T201 and T202 are simultaneously turned on, the high potential voltage VDD is charged in the second Q node Q2. That is, the first and second transistors T201 and T202 charge the first Q node Q1 when the ith block signal BCLKi and the (i+4)th emission clock ECLK(i+4) are synchronized.

A first electrode of the third transistor T203 is connected to the second electrode of the first transistor T201, a second electrode thereof is connected to the third Q node Q3, and a gate electrode thereof is connected to a first assist clock ACLK1. Thus, the first and third transistors T201 and T203 charge the third Q node Q3 when the ith block signal BCLKi and the ith assist clock ACLK(i+4) are synchronized.

The fourth transistor T204 receives a high potential voltage VDD through a first electrode, and a second electrode is connected to the first electrode of the fifth transistor T205, and a gate electrode thereof is connected to the (i+4)th block signal BCLK(i+4). A second electrode of the fifth transistor T204 is connected to the third QB node QB3, and a gate electrode thereof is connected to the ith assist clock ACLKi. Thus, the fourth and fifth transistors T204 and T205 charge the third QB node QB3 when the (i+4)th block signal BCLK (i+4) and the ith assist clock ACLKi are synchronized. That is, the fourth transistor T104 discharges the third output terminal n13 when the (i+4)th block signal BCLK(I+4) and the ith assist clock ACLKi are synchronized.

A gate electrode of the third pull-up transistor T206 is connected to the third Q node Q3, a first electrode is connected to an input terminal of the high potential voltage VDD, and a second electrode thereof is connected to the third output terminal n13.

A gate electrode of the third pull-down transistor T207 is connected to the third QB node QB3, a first electrode thereof is connected to an input terminal of the low potential voltage, and a second electrode thereof is connected to the third output terminal n13. Thus, the third pull-down transistor T307 discharges the potential of the third output terminal n13 to the low potential voltage VDD to correspond to the potential of the third QB node QB3.

A first electrode of the eighth transistor T208 is connected to an input terminal of the high potential voltage VDD, a second electrode thereof is connected to the third QB node QB3, and a gate electrode thereof is connected to the input terminal of the (i+1)th assist clock ACLK(i+1).

A first electrode of the ninth transistor T209 is connected to the input terminal of the high potential voltage VDD, a second electrode thereof is connected to the third QB node QB3, and a gate electrode thereof is connected to the input terminal of the (i+2)th assist clock ACLK(I+2).

A first electrode of the tenth transistor T210 is connected to the input terminal of the high potential voltage VDD, a second electrode thereof is connected to the third QB node QB3, and a gate electrode thereof is connected to the input terminal of the (i+2)th emission clock ECLK(i+2).

A first electrode of the 11th transistor 211 is connected to the third Q node Q3, a second electrode thereof is connected to the low potential voltage VSS, and a gate electrode thereof is connected to the third QB node QB3. Thus, the 11th transistor T111 discharges the potential of the third Q node Q3 to the low potential voltage VSS to correspond to the potential of the third QB node QB3.

A first electrode of the 12th transistor T212 is connected to the third QB node, a second electrode thereof is connected to the first electrode of the 13th transistor T213, and a gate electrode thereof is connected to the input terminal of the ith block signal BCLKi. A second electrode of the 13th transistor T213 is connected to the low potential voltage VSS, and a gate electrode thereof is connected to the (i+3)th emission clock ECLK(i+3). Thus, the 12th and 13th transistors T212 and T213 discharge the potential of the third Q node Q3 to the low potential voltage VSS to correspond to the potential of the third Q node Q3.

A first electrode of the 14th transistor T214 is connected to the second electrode of the 12th transistor, a second electrode thereof is connected to the low potential voltage VSS, and a gate electrode thereof is connected to the ith assist clock ACLK(i+1).

FIG. 8 is a timing diagram illustrating inputs and outputs of the first to fourth scan signal generating units UNIT1 to UNIT4.

During an initialization period Ti, first and second transistors T1MT2 of the first to fourth scan signal generating units UNIT1 to UNIT4 are turned on by a first block signal BCLK1 and a fourth emission clock ECLK4, respectively. Thus, during the initialization period Ti, first and second transistors T1 and T2 of the of the first to fourth scan signal generating units UNIT1 to UNIT4 charge the third Q node Q3. The third pull-up transistor T206 outputs the high potential voltage VDD to the third output terminal n13 to correspond to a potential of the third Q node Q3 charged with a high potential. That is, during the initialization period Ti, the first to fourth scan signals SCAN1 to SCAN 2 are output through the third output terminal n13.

At an end time of the initialization period Ti, the fourth and fifth transistors T204 and T204 are turned on upon receiving the fifth block signal BCLK5 and the first assist clock ACLK1, respectively. The turned-on fourth and fifth transistors T204 and T204 charge the high potential voltage VDD in the third QB node QB3. As the third QB node QB3 is charged, the third pull-up transistor T206 discharges the third output terminal n13 to the low potential voltage VSS. That is, at the end time of the initialization period Ti, the first to fourth scan signals SCAN1 to SCAN 4 are discharged to the low potential voltage VSS.

During the sampling period ts, the first and second transistors T1 and T2 of the first to fourth scan signal generating units UNIT1 to UNIT4 are turned on by the first block control signal BCLK 1 and the fourth emission clock ECLK4, respectively. Thus, during the initialization period Ti, the first and second transistors T201 and T202 of the first to fourth scan signal generating units UNIT1 to UNIT4 charge the third Q node Q3. The third pull-up transistor T206 outputs the high potential voltage VDD to the third output terminal n13 to correspond to the potential of the Q node Q3 charged with the high potential. That is, during the sampling period Ts, the first to fourth scan signals SCAN1 to SCAN4 are output through the third output terminal n13.

Operations of the first to fourth scan signal generating units UNIT1 to UNIT4 during a data write period Tw will be described.

First, an operation of the first scan signal generating unit UNIT1 is as follows.

During a second data write period Tw2, the eighth transistor T208 of the first scan signal generating unit UNIT is turned on by the second assist clock ACLK2 to charge the third QB node QB3. As the third QB node QB3 is charged, the third pull-up transistor T206 discharges the third output terminal n13 to the low potential voltage VSS. That is, output of the first scan signal SCAN is stopped after the first data write period Tw1.

An operation of the second scan signal generating unit UNIT2 is as follows.

During the first data write period Tw1, the ninth transistor T209 of the second scan signal generating unit UNIT2 is turned on by the first assist clock ACLK1 to charge the third QB node QB3. The third pull-up transistor T206 outputs the high potential voltage VDD to the third output terminal n13 to correspond to the potential of the third Q node Q3 charged with the high potential.

During the second data write period Tw2, the first and third transistors T201 and T203 of the second scan signal generating unit UNIT2 are turned on by the first block signal BCLK1 and the first assist clock ACLK1, respectively, to charge the third Q node Q3. The third pull-up transistor T206 outputs the high potential voltage VDD to the third output terminal n13 to correspond to the potential of the third Q node Q3 charged with the high potential.

During the third data write period Tw3, the eighth transistor T208 of the third scan signal generating unit UNIT3 is turned on by the second assist clock ACLK2 to charge the third QB node QB3. As the third QB node QB3 is charged, the third pull-up transistor T206 discharges the third output terminal n13 to the low potential voltage VSS.

An operation of the third scan signal generating unit UNIT3 is as follows.

During the first data write period Tw1, the ninth transistor T209 of the third scan signal generating unit UNIT3 is turned on by the first assist clock ACLK1 to charge the third QB node QB3. The third pull-up transistor T206 outputs the high potential voltage VDD to the third output terminal n13 to correspond to the potential of the third Q node Q3 charged with the high potential.

During the third data write period Tw3, the first and third transistors T201 and T203 of the third scan signal generating unit UNIT3 are turned on by the first block signal BCLK1 and the first assist clock ACLK1, respectively, to charge the third Q node Q3. The third pull-up transistor T206 outputs the high potential voltage VDD to the third output terminal n13 to correspond to the potential of the third Q node Q3 charged with the high potential.

During a fourth data write period Tw4, the eighth transistor T208 of the third scan signal generating unit UNIT3 is turned on by the fourth assist clock ACLK4 to charge the third QB node QB3. As the third QB node QB3 is charged, the third pull-up transistor T206 discharges the third output terminal n13 to the low potential voltage VSS.

An operation of the fourth scan signal generating unit UNIT4 is as follows.

During the first data write period Tw1, the ninth transistor T209 of the fourth scan signal generating unit UNIT4 is turned on by the first assist clock ACLK1 to charge the third QB node QB3. The third pull-up transistor T206 outputs the high potential voltage VDD to the third output terminal n13 to correspond to the potential of the third Q node Q3 charged with the high potential.

During the fourth data write period Tw4, the first and third transistors T201 and T203 of the fourth scan signal generating unit UNIT4 are turned on by the first block signal BCLK1 and the fourth assist clock ACLK4, respectively, to charge the third Q node Q3. The third pull-up transistor T206 outputs the high potential voltage VDD to the third output terminal n13 to correspond to the potential of the third Q node Q3 charged with the high potential.

In the present invention, since a plurality of horizontal lines are set to a block, and a sampling operation is simultaneously performed on the horizontal lines included in the same block, a sufficient sampling period may be secured.

In particular, in order to perform block driving, a block signal output from a block signal generating unit is used as a carrier signal of a rear stage block signal generating unit and a clock signal of a GIP structure, and a falling time point of a scan signal may be performed sequentially by using a separate assist clock. Thus, waveforms of scan signals output from each of scan signal generating units may be different, whereby scan signals for sequential driving may be output at a data write stage.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting display device comprising:
    a display panel including 4m (m is a natural number) number of horizontal lines in which organic light emitting diodes (OLED) are arranged; and
    first to mth stage blocks configured to provide a scan signal and an emission control signal to each of the horizontal lines,
    wherein an ith (i is a natural number equal to or smaller than m) stage block comprises:
    an ith block signal generating unit configured to generate any one of first to fifth block signals by using first to fifth gate clocks;
    an ith emission control signal generating unit configured to generate an ith emission control signal by using first to fifth emission clocks; and
    a (4i−3)th to 4ith scan signal generating units configured to generate (4i−3)th to 4ith scan signals, respectively, by using ith to (i+3)th assist clocks.

2. The organic light emitting display device of claim 1, wherein the ith emission control signal generating unit uses the ith block signal as a start signal.

3. The organic light emitting display device of claim 1, wherein the first to fourth assist clocks are used as switching signals for lowering outputs from the (4i−3)th to 4ith scan signal generating units to low potentials.

4. The organic light emitting display device of claim 1, wherein the (4i−3)th to 4ith scan signals overlap each other during at least a predetermined period.

5. The organic light emitting display device of claim 1, wherein pixels arranged in the (4i−3)th to 4ith horizontal lines comprise:
- a driving transistor configured to control a driving current provided to the OLED;
- a first transistor configured to receive the ith emission control signal through a gate electrode thereof and having first and second electrodes connected to a high potential voltage source and a drain electrode of the driving transistor, respectively;
- a second transistor configured to receive an (i−1)th block signal through a gate electrode thereof and having first and second electrodes connected to an initialization line and a source electrode of the driving transistor, respectively; and
- a third transistor configured to receive any one of the (4i−3)th to 4ith scan signals through a gate electrode thereof and having first and second electrodes connected to a data line and a gate electrode of the driving transistor, respectively.

6. The organic light emitting display device of claim 5, wherein the (4i−3)th to 4ith scan signals overlap in a section in which the (i−1)th block signal is output within a scan period of the (i−1)th stage block.

7. The organic light emitting display device of claim 5, wherein the (4i−3)th to 4ith scan signals overlap in a section in which the ith emission control signal is output within a scan period.

* * * * *